United States Patent  (10) Patent No.: US 9,053,785 B2
Krebs et al.  (45) Date of Patent: Jun. 9, 2015

(54) PHASE-CHANGE MEMORY CELL (71) Applicant: International Business Machines Corporation, Armonk, NY (US)

(72) Inventors: Daniel Krebs, Rueschlikon (CH); Abu Sebastian, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 161 days.

(21) Appl. No.: 13/782,477

(22) Filed: Mar. 1, 2013

(65) Prior Publication Data

US 2013/0258767 A1 Oct. 3, 2013

(30) Foreign Application Priority Data

Mar. 30, 2012 (GB) .................................. 1205686.7

(51) Int. Cl.
  *G11C 11/00* (2006.01)
  *G11C 13/00* (2006.01)
  *G11C 11/56* (2006.01)
  *H01L 45/00* (2006.01)

(52) U.S. Cl.
  CPC ........ *G11C 13/0009* (2013.01); *G11C 11/5678* (2013.01); *G11C 11/56* (2013.01); *G11C 13/0004* (2013.01); *H01L 45/06* (2013.01); *H01L 45/1206* (2013.01); *H01L 45/1233* (2013.01); *H01L 45/144* (2013.01)

(58) Field of Classification Search
  CPC .. G11C 13/004; G11C 11/5678; G11C 11/56; G11C 13/0009
  USPC ........ 365/163, 148, 158, 191, 189.07, 189.09
  See application file for complete search history.

(56) References Cited

U.S. PATENT DOCUMENTS

| 6,259,116 | B1 | 7/2001 | Shannon |
| 7,186,998 | B2 | 3/2007 | Ovshinsky et al. |
| 8,363,446 | B2* | 1/2013 | Czubatyj et al. .............. 365/148 |
| 2006/0077706 | A1 | 4/2006 | Li et al. |
| 2007/0133270 | A1 | 6/2007 | Jeong et al. |
| 2008/0094873 | A1 | 4/2008 | Lai et al. |
| 2008/0179583 | A1 | 7/2008 | Burr |
| 2008/0191186 | A1 | 8/2008 | Lung et al. |
| 2008/0237566 | A1 | 10/2008 | An et al. |
| 2009/0268505 | A1 | 10/2009 | Beer |
| 2010/0182827 | A1* | 7/2010 | Kostylev et al. .............. 365/163 |
| 2011/0096594 | A1 | 4/2011 | Franceschini et al. |

FOREIGN PATENT DOCUMENTS

KR 20100070155 A 6/2010

* cited by examiner

*Primary Examiner* — Gene Auduong
(74) *Attorney, Agent, or Firm* — Cantor Colburn LLP (57) ABSTRACT

A phase-change memory cell includes a phase change material; a reference electrical terminal disposed on first side of the phase change material; first and second electrical terminals disposed on a second side of the phase change material; the phase-change material configured to be reversibly transformable between an amorphous phase and a crystalline phase, in response to a phase-altering electrical signal applied to the phase-change material via the reference electrical terminal and one or more of the first and second electrical terminals; a resistance measurement unit configured to measure a respective electrical resistance between each of the first and electrical terminals and the reference electrical terminal; and a mathematical operation unit configured to determine a mathematical relation between the respective electrical resistances measured between each of the electrical terminals and the reference electrical terminal.

18 Claims, 7 Drawing Sheets

PHASE-CHANGE MEMORY CELL

PRIORITY

This application claims priority to Great Britain Patent Application No.: 1205686.7, filed Mar. 30, 2012, and all the benefits accruing therefrom under 35 U.S.C. §119, the contents of which in its entirety are herein incorporated by reference.

BACKGROUND

The present invention relates to a phase-change memory cell and a method of operating a phase-change memory cell.

For data storage, phase-change memory cells may be used. A typical configuration of a phase-change memory cell comprises a phase-change material arranged between and coupled to at least two electrodes. When the phase-change memory cell is in use, the phase-change material is operated in one of at least two reversibly transformable phases, an amorphous phase and a crystalline phase, these phases of the phase-change material being distinct from one another, in that, in the amorphous phase, the phase-change material has a discernibly higher resistance, by up to a few orders of magnitude, compared to the crystalline phase thereof. In order to facilitate a phase transition, energy is supplied to the phase-change material such as, for example, electrical energy, thermal energy, any other suitable form of energy or combination thereof that may effectuate a desired phase transition.

For example, to facilitate a change from the crystalline phase to the amorphous phase, an electrical signal such as a voltage pulse may be applied to one of the electrodes, such an electrode being hereinafter generally referred to as a heater electrode, whereby the characteristics of the voltage pulse applied to the heater electrode are chosen so as to cause heating of the phase-change material, at the heater electrode or substantially in the vicinity thereof, above its melting temperature and, thereafter, rapid cooling below its glass temperature. The phase-change material that is treated in this way is transformed from the crystalline phase to the amorphous phase and an amorphized area is created in the phase-change material where such a phase-transition has occurred. The size of the amorphized area corresponds to the molten area created by the melting of the phase-change material, and is dependent on the magnitude of the applied voltage. The profile of the amorphized area is defined by a temperature profile that is created in the phase-change material due to the application of the voltage pulse to the heater electrode, the temperature profile being influenced by a geometric design of the phase-change memory cell. Where the phase-change memory cell is designed to have a relatively high resistive area, such as, for example, due to the design used for the heater electrode, a larger voltage drop and a higher temperature will occur compared to other areas of the phase-change memory cell, resulting in the creation of a so-called hotspot in the phase-change material at such an area.

As hereinbefore described, the application of a specific voltage pulse to the heater electrode facilitates the creation of an amorphous area, having a corresponding resistance, in the phase-change material. In order to store information, the resistance of the phase-change memory cell is read out. That is, the resistance between the two electrodes is measured after an amorphous area is created in the phase-change material by the application of a given voltage to the heater electrode. A given resistance that is recorded between the two electrodes is defined by the size/volume of the amorphous area created in the phase-change material and depends on the amorphous aspect and/or crystalline aspect of the phase-change material in the current path that is established between the two electrodes.

Figure 1:
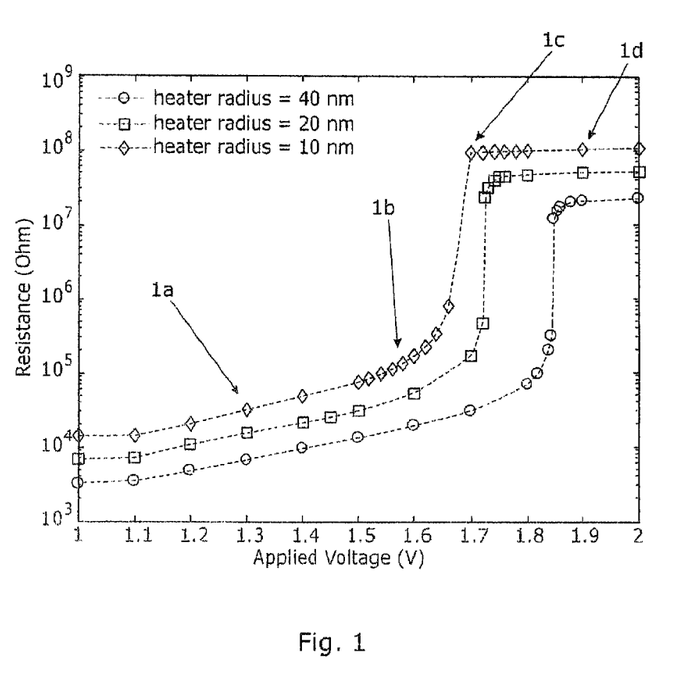
FIG. 1 (as described above) shows a plot of RV curves obtained for a phase-change memory cell.

Reference is now made to FIG. 1 of the accompanying drawings, which shows an example of a plot of the resistance R recorded between the heater electrode and another electrode of a given phase-change memory cell as a function of the voltage V applied to the heater electrode. The plot shown in FIG. 1 is typically obtained for phase-change memory cells and will hereinafter be generally referred to as an RV curve. The example of FIG. 1 shows RV curves that have been simulated for the heater electrode having a respective radius of 40 nm, 20 nm and 10 nm.

As can be seen from FIG. 1, where the application of a voltage pulse to the heater electrode causes the creation of a relatively small amorphous area in the phase-change material, the resistance between the electrodes of the phase-change memory cell will be recorded as having increased relatively slightly. In this case, the size of the created amorphous area is relatively small and the phase-change material in the current path between the two electrodes may comprise substantially more of a crystalline aspect rather than an amorphous aspect. Thus, the current flowing between the two electrodes will have access to and will preferentially flow through the lower resistance, crystalline aspect of the phase-change material. This scenario is generally marked on FIG. 1 by the arrow 1a.

Additional increases in the size of the amorphous area formed in the phase-change material, which are facilitated by progressively increasing the magnitude of the voltage applied to the heater electrode, result in correspondingly increased resistance values to be recorded for the phase-change memory cell, this scenario being generally marked by the arrow 1b on FIG. 1. In this case, while the current flowing between the two electrodes still has access to the crystalline aspect of the phase-change material, this is to a lesser extent than in the scenario denoted by arrow 1a and is further reduced with the growth/increased volume of the amorphous aspect of the phase-change material as the magnitude of voltage applied to the heater electrode is increased.

Where the voltage applied to the heater electrode causes the creation of an amorphous area that plugs/blocks the heater electrode, the current flowing between the two electrodes may no longer completely bypass the higher resistance, amorphous aspect of the phase-change material in the current path between the two electrodes and has to flow through it. Furthermore, at least until the current flows through the amorphous aspect, it has relatively little or no access to the lower resistance, crystalline aspect of the phase-change material in the current path between the two electrodes. This scenario is recorded as a steep increase in the resistance of the phase-change memory cell and is denoted by arrow 1c on FIG. 1. Where a magnitude of the voltage applied to the heater electrode is further increased, the size/volume of the amorphous aspect between the two electrodes grows whereas the crystalline aspect of the phase-change material is further reduced. Thus, the current flowing between the two electrodes has to flow through even more of the amorphous aspect and has lesser access to the crystalline aspect compared to the previously-described scenario denoted by arrow 1c, thereby causing the RV curve to plateau as generally shown by arrow 1d on FIG. 1.

As hereinbefore described, information is stored in phase-change memory cells by using a resistance of the phase-change memory cell defined by the size/volume of the amorphous area that is created in the phase-change material for a given voltage being applied to at least an electrode, for example, the heater electrode, of the phase-change memory cell. In this regard, the read out resistance is not subjected to further manipulation for the purpose of addressing information storage in phase-change memory cells. Furthermore, by exploiting only the size/volume aspect of the amorphous area, information storage in phase-change memory cells may be correspondingly limited.

U.S. Pat. No. 7,186,998 discloses a multi-terminal logic device, which includes a phase-change material having crystalline and amorphous states in electrical communication with three or more electrical terminals. The phase-change material is able to undergo reversible transformations between amorphous and crystalline states in response to applied electrical energy where the amorphous and crystalline states show measurably distinct electrical resistances. Electrical energy in the form of current or voltage pulses applied between a pair of terminals influences the structural state and measured electrical resistance between the terminals. In the devices disclosed in this document, independent input signals are provided between different pairs of terminals and the output is measured as the resistance between yet another pair of terminals. Logic functionality is achieved through relationships between the applied input signals and the measured output resistance where the relationship is governed by the effect of the input signals on the structural state and the electrical resistance of the phase-change material. Logic values may be associated with the crystalline and amorphous states of the phase-change material or the measured resistance between a pair of terminals.

U.S. Pat. No. 7,186,998 discloses a method of operating a phase-change memory cell, thereby to achieve a given logic functionality. The disclosed phase-change memory cell has three terminals, whereby the respective input signals applied across two different pairs of terminals may be used to create crystalline or amorphous states in the phase-change material, having corresponding resistances that are discernible from each other and that may be used to represent requisite inputs of a given logic function. An output resistance measured between a third pair of terminals corresponds to the output of the logic function. It is stated in this document that the measured resistance between a pair of electrical terminals may depend not only on the resistance of the chalcogenide material, which is used as the phase-change material, but also on the spatial distribution of crystalline and amorphous regions within the chalcogenide material and the size and position of one or both terminals of a pair relative to the volume of chalcogenide material influenced by a signal applied between the terminals.

U.S. Pat. No. 7,186,998 discloses a method of operating a phase-change memory cell, thereby to achieve logic functionality; it does not disclose and/or address how to provide a range for information storage in phase-change memory cells.

U.S. Patent Application Publication 2011/0096594 discloses techniques for reading phase change memory that mitigate resistance drift. One contemplated method includes applying a plurality of electrical input signals to the memory cell. The method includes measuring a plurality of electrical output signals from the memory cell resulting from the plurality of electrical input signals. The method includes calculating an invariant component of the plurality of electrical output signals dependent on the configuration of amorphous material in the memory cell. The method also includes determining a memory state of the memory cell based on the invariant component. In one embodiment of the invention disclosed in that document, the method further includes mapping the plurality of electrical output signals to a measurements region of a plurality of measurements regions. The measurements regions correspond to memory states of the memory cell.

U.S. Patent Application Publication 2011/0096594 is concerned with deriving a quantity that is dependent on the structural state of the phase-change material, that is, whether it is amorphous or crystalline, but which is different to/not the resistance of the memory cell. The aforementioned quantity is read out by applying multiple electrical signals to a memory cell with a single pair of terminals. U.S. Patent Application Publication 2011/0096594 does not disclose and/or address how to provide a range for information storage in phase-change memory cells.

Accordingly, it is desirable to provide a phase-change memory cell having increased versatility in the way information storage is achieved with ease of implementation and relatively reduced technical complexity.

SUMMARY

In one embodiment, a phase-change memory cell includes a phase change material; a reference electrical terminal disposed on first side of the phase change material; first and second electrical terminals disposed on a second side of the phase change material; the phase-change material configured to be reversibly transformable between an amorphous phase and a crystalline phase, in response to a phase-altering electrical signal applied to the phase-change material via the reference electrical terminal and one or more of the first and second electrical terminals; a resistance measurement unit configured to measure a respective electrical resistance between each of the first and electrical terminals and the reference electrical terminal; and a mathematical operation unit configured to determine a mathematical relation between the respective electrical resistances measured between each of the electrical terminals and the reference electrical terminal.

In another embodiment, a method of operating a phase-change memory cell, the phase-change memory cell comprising a phase change material, a reference electrical terminal disposed on first side of the phase change material, first and second electrical terminals disposed on a second side of the phase change material, the phase-change material configured to be reversibly transformable between an amorphous phase and a crystalline phase, includes applying a phase-altering electrical signal to the phase-change material via the reference electrical terminal and one or more of the first and second electrical terminals; measuring a respective electrical resistance between each of the electrical terminals and the reference electrical terminal; and determining at least a mathematical relation between the respective electrical resistances measured between each of the electrical terminals and the reference electrical terminal.

BRIEF DESCRIPTION OF THE SEVERAL VIEWS OF THE DRAWINGS

Reference will now be made, by way of example, to the accompanying drawings, in which:

FIG. 3 in which FIGS. 3A to 3I schematically illustrate examples of the formation of the amorphous area in an embodiment of the present invention as shown in FIG. 2, and FIG. 4 schematically illustrates a further embodiment of the present invention.

DETAILED DESCRIPTION

According to an embodiment of a first aspect of the present invention, there is provided a phase-change memory cell comprising: at least a reference electrical terminal; at least two electrical terminals that are configurable to be supplied with respective electrical signals and at least a phase-change material that is provided between, and coupled to each of, the reference electrical terminal and the two electrical terminals, the phase-change material being operable in one of at least two reversibly transformable phases, an amorphous phase and a crystalline phase, a transition from one phase to the other phase occurring in response to a corresponding phase-altering electrical signal being applied to the phase-change material, wherein when the phase-change memory cell is in use: the respective electrical signals supplied to the electrical terminals are configurable to comprise the phase-altering signal, at least a resistance measurement unit is accessible to measure a respective electrical resistance between each of the electrical terminals and the reference electrical terminal, and at least a mathematical operation unit is accessible to determine at least a mathematical relation between the respective electrical resistances measured between each of the electrical terminals and the reference electrical terminal. In an embodiment of the present invention, a given mathematical relation that is determined between the respective electrical resistances measured between each of the electrical terminals and the reference electrical terminal serves as a way in which information storage may be achieved in the phase-change memory cell. By determining different mathematical relations between the respective electrical resistances measured between each of the electrical terminals and the reference electrical terminal, a range for information storage may be provided and/or extended. This aspect/feature lies in contrast to previously-proposed phase-change memory cells and/or corresponding methods of operation, where resistances associated with an amorphous area created in the phase-change material may be read out, but they are not further manipulated for the purpose of extending the information storage range as in an embodiment of the present invention. Furthermore, in an embodiment of the present invention, the provision of such a range for information storage is done with relatively few technical modifications, for example, by introducing accessibility to a resistance measurement unit and a mathematical operation unit, which extends the advantages of ease of implementation to an embodiment of the present invention and relatively minor adjustments and/or technical modifications to, for example, an electrical circuit and/or device into which the an embodiment of the present invention may be integrated.

Preferably, the mathematical relation unit is configurable to calculate a difference between the respective electrical resistances measured between each of the electrical terminals and the reference electrical terminal. In contrast to previously-proposed phase-change memory cells where a single dimension is used for information storage, a difference between the respective electrical resistances measured between each of the electrical terminals and the reference electrical terminal provides a two-dimensional space for information storage. Furthermore, by way of this feature, $n^2-(n-1)$ resistance levels may be stored in an embodiment of the present invention comprising the reference electrical terminal and two of the electrical terminals whereas n resistance levels may be stored in known phase-change memory cells. Thus, this feature of an embodiment of the present invention has the advantages of providing a range in which information may be stored and increased information storage capacity.

Desirably, the mathematical relation unit is configurable to calculate a sum of the respective electrical resistances measured between each of the electrical terminals and the reference electrical terminal. An advantage associated with this feature of an embodiment of the present invention is that it provides an alternative way in which information may be stored. This feature, when combined with the calculated difference between the respective electrical resistances measured between each of the electrical terminals and the reference electrical terminal, provides the advantage that both of the size and the spatial distribution/position of the amorphous area formed in the phase-change material between the reference electrical terminal and the two electrical terminals may be used for information storage, so further extending a range for information storage in an embodiment of the present invention.

Desirably, the mathematical relation unit is configurable to perform a mathematical operation of at least one of the respective electrical resistances measured between each of the electrical terminals and the reference electrical terminal with: the difference calculated between the respective electrical resistances, the sum calculated of the respective electrical resistances or a combination thereof. This feature extends the advantage of increased information storage capability to an embodiment of the present invention. Furthermore, unlike previously-proposed phase-change memory cells and/or corresponding techniques, the respective electrical resistance values are not simply determined but may be used individually to extend the information storage capability of an embodiment of the present invention.

Preferably, the resistance measurement unit is configurable to measure a respective electrical resistance between each electrical terminal and at least a neighboring electrical terminal in the phase-change memory cell. An embodiment of the present invention is not limited to the provision of a phase-change memory cell with three electrical terminals, namely, the reference electrical terminal and two electrical terminals. Indeed, more electrical terminals may be provided, in which case, a given resistance difference calculated for a given set of electrical terminals may be used for information storage and thus, a multi-dimensional space is created for information storage. With the provision of more electrical terminals in an embodiment of the present invention, the number of levels for information storage may be increased, whereby, approximately $n^d$ levels may be provided, where d corresponds to the number of resistance difference values calculated for neighboring electrical terminals in an embodiment of the present invention. This is in contrast to previously-proposed, multiple terminal phase-change memory cells which may provide only n levels for information storage.

Desirably, the mathematical relation unit is a part of, or remotely situated from, an integrated electrical circuit comprising the phase-change memory cell. This feature provides the advantages of flexibility and ease of implementation. Furthermore, the choice of providing the mathematical relation unit on-site or remotely may be done in accordance with implementation complexity considerations and/or to reduce a demand on the technical/energy resources of an electrical circuit/semiconductor device into which an embodiment of the present invention may be integrated.

Preferably, at least a geometric design of at least one of the electrical terminals is selected thereby to facilitate a desired alteration of a thermal environment of the phase-change memory cell. In this regard, desirably, a radius of the electrical terminal, a length of the electrical terminal or a combination thereof is altered. In an embodiment of the present invention, a profile of the amorphous area that is created in the phase-change material is defined by a temperature profile that is created in the phase-change material by the respective electrical signals being applied to the electrical terminals. In this regard, a desired temperature profile may be obtained by altering at least a geometric design of at least one of the electrical terminals. So, and by way of example, a radius and/or a length of a given electrical terminal may be altered in order to create a hotspot, for the formation of the amorphous area, as desired in the phase-change material.

Preferably, the phase-altering signal is selected thereby to facilitate a phase-transition from a crystalline phase to the amorphous phase in the phase-change material. The higher electrical resistance of the phase-change material in an amorphous phase compared to the crystalline phase may be used to advantage for ease of measurement of the respective electrical resistances between the reference electrical terminal and each of the electrical terminals in an embodiment of the present invention.

Desirably, at least a characteristic of the respective electrical signals supplied to the electrical terminals is selected so that an amorphous area of a desired size and spatial distribution is formed in the phase-change material. In this way, a full range of resistances that are obtained by different sizes and spatial distribution of the amorphous area formed in the phase-change material between the reference electrical terminal and the electrical terminals in an embodiment of the present invention may be exploited for the purpose of information storage.

Preferably, each of the electrical signals is selected to be a respective voltage pulse. In order to facilitate the creation of an amorphous area of a desired size and spatial distribution in the phase-change material, a given magnitude of each of the voltage pulses that are respectively applied to the electrical terminals in an embodiment of the present invention may be used and/or appropriately chosen, for example.

Desirably, at least one of the electrical terminals is supplied with its respective electrical signal. This feature extends the advantage that only one of the electrical terminals in an embodiment of the present invention may be engaged, by the application of a respective electrical signal thereto, in order to create an amorphous area in the phase-change material and, thereby, store information. This feature also extends the further advantage that the amorphous area may be created in a desired position, that is, substantially between the given electrical terminal to which a respective electrical signal is applied and the reference terminal, and to be of a desired size, depending on the characteristic(s) of the respective electrical signal supplied to the given electrical terminal in an embodiment of the present invention.

Preferably, and as an alternative, each of the electrical terminals is supplied with its respective electrical signal. This feature extends the advantage that an amorphous area may be created substantially between the electrical terminals supplied with their respective electrical signals and the reference electrical terminal. Furthermore, the spatial distribution and/or the size of the created amorphous area may be tailored by way of the respective electrical signals supplied to the electrical terminals in an embodiment of the present invention.

Desirably, each of the electrical terminals may be supplied with its respective electrical signal at substantially the same time. This feature extends the advantage of ease of implementation since separate timing considerations for providing each of the electrical terminals with its respective electrical signal may not be done. Regarding timing considerations for the provision of respective electrical signals to each of the electrical terminals in an embodiment of the present invention, and as an alternative to the previously-described scenario, the respective electrical signals may be separated from each other in the time-domain by a given time-delay. This feature provides an alternative way for the creation of the amorphous area between the reference terminal and the electrical terminals in an embodiment of the present invention. It differs from the previously-described scenario in that the resistance profile of the phase-change material is non-uniform/already altered before the completion of the time-delay and the application of a respective electrical signal to another electrical terminal in an embodiment of the present invention. The respective electrical signals may also be provided such that they overlap with each other in the time-domain, which feature may provide the advantage of different, desired profiles for the amorphous area created in the phase-change material to be facilitated as compared to when the respective electrical signals are supplied to the electrical terminals at substantially the same time and/or when a time-delay without an overlap is introduced in the supply of the respective electrical signals to the electrical terminals in an embodiment of the present invention.

According to an embodiment of a second aspect of the present invention, there is provided a non-volatile memory device comprising at least a phase-change memory cell according to an embodiment of the first aspect of the present invention. The advantageous features and/or properties of a phase-change memory cell as described above are also displayed by an embodiment of the second aspect of the present invention.

A corresponding method aspect is also provided, and so, according to an embodiment of a third aspect of the present invention, there is provided a method of operating a phase-change memory cell, the phase-change memory cell comprising: at least a reference electrical terminal; at least two electrical terminals that are configurable to be supplied with respective electrical signals, and at least a phase-change material that is provided between, and coupled to each of, the reference electrical terminal and the two electrical terminals, the phase-change material being operable in one of at least two reversibly transformable phases, an amorphous phase and a crystalline phase, a transition from one phase to the other phase occurring in response to a corresponding phase-altering electrical signal being applied to the phase-change material, the method comprising the steps of: configuring the respective electrical signals supplied to the electrical terminals to comprise the phase-altering signal; measuring a respective electrical resistance between each of the electrical terminals and the reference electrical terminal, and determining at least a mathematical relation between the respective electrical resistances measured between each of the electrical terminals and the reference electrical terminal.

Features of one aspect may be applied to any other aspect and vice versa. Any disclosed embodiment may be combined with one or several of the other embodiments shown and/or described. This is also possible for one or more features of the embodiments.

Within the description, the same reference numerals or signs have been used to denote the same parts or the like.

Figure 2:
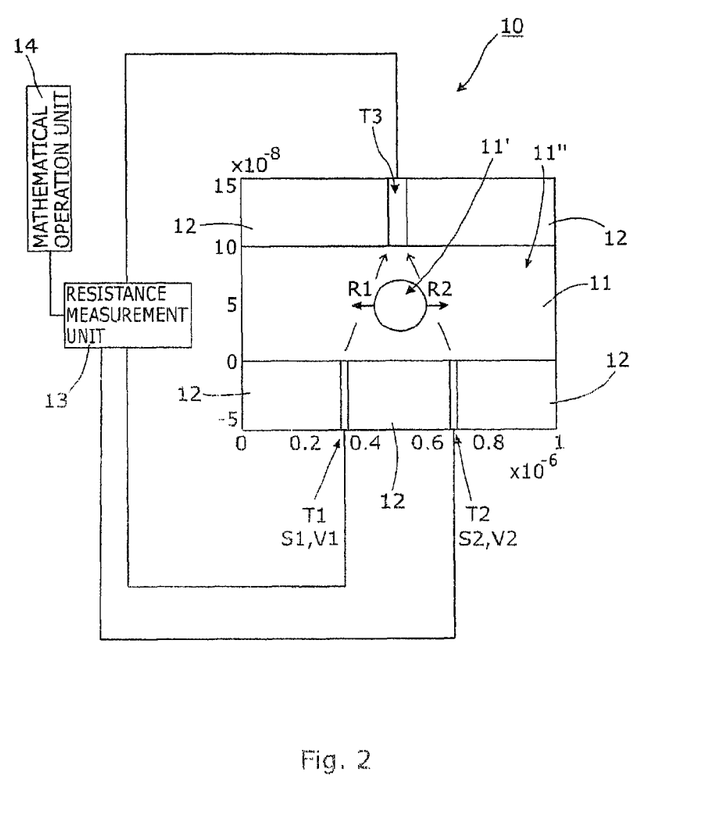
FIG. 2 schematically illustrates an embodiment of the present invention.

Reference is now made to FIG. 2, which shows an embodiment of the present invention. As can be seen from FIG. 2, there is provided a phase-change memory cell 10 with multiple electrical terminals, which comprise at least a reference electrical terminal T3 and at least two electrical terminals T1, T2. When the phase-change memory cell 10 is in use, the two electrical terminals T1, T2 are configurable to be supplied with respective electrical signals S1, S2. In between the reference electrical terminal T3 and the two electrical terminals T1, T2, there is provided a phase-change material 11. The reference electrical terminal T3 and the two electrical terminals T1, T2 are implemented such that they are each coupled to, and provided in electrical communication with, the phase-change material 11. In an embodiment of the present invention, the reference electrical terminal T3 and the two electrical terminals T1, T2 may comprise titanium nitride or tungsten, for example.

In an embodiment of the present invention, the phase-change material 11 is operable in one of at least two reversibly transformable phases, an amorphous phase and a crystalline phase, these phases of the phase-change material 11 being distinct from one another in that, in the amorphous phase, the phase-change material 11 has a discernibly higher resistance compared to the crystalline phase thereof, there being, typically, a two to three orders, and up to five orders of magnitude contrast in the electrical resistance between the respective phases. A phase-transition from one phase to another phase may be facilitated by the application of a corresponding phase-altering electrical signal to the phase-change material 11. For the phase-change material 11, a suitably chosen germanium antimony tellurium alloy may be used in an embodiment of the present invention.

When the phase-change memory cell 10 is in use, the respective electrical signals S1, S2 provided to the two electrical terminals T1, T2 are configured to comprise the phase-altering electrical signal, which facilitates a phase-transition from a crystalline phase to the amorphous phase in the phase-change material 11. By such an action, the phase-change material 11 comprises an amorphous area 11' and a crystalline area 11" as illustrated in FIG. 2.

In an embodiment of the present invention, at least a characteristic of each of the electrical signals S1, S2, which are supplied to the electrical terminals T1, T2 may be selected so that an amorphous area 11' of a desired size and spatial distribution is formed in the phase-change material 11.

In an embodiment of the present invention, the electrical signal S1 supplied to the electrical terminal T1 may be chosen to be a voltage pulse V1 that causes a phase-alteration in the phase-change material 11, thereby to facilitate an amorphous area 11' to be created, between the electrical terminal T1 and the reference electrical terminal T3. Also, the electrical signal S2 that is supplied to the terminal T2 may be chosen to be a voltage pulse V2 that causes a phase-alteration in the phase-change material 11, thereby to facilitate an amorphous area 11' to be created, between the electrical terminal T2 and the reference electrical terminal T3. In an embodiment of the present invention, a given voltage pulse V1, V2 may be a pulse having a duration of 100 ns and a trailing edge of less than 10 ns, for example. Where the creation of the amorphous area 11' in the phase-change material 11 between the reference electrical terminal T3 and the two electrical terminals T1, T2, is facilitated by applying respective voltage pulses V1, V2 to electrical terminals S1, S2, the size of amorphous area 11' is determined by the respective magnitudes of voltage pulses V1, V2 and the spatial distribution of the amorphous area 11' is determined by a difference between the magnitudes of the respective voltage pulses V1, V2.

In one scenario of an embodiment of the present invention, only one of the electrical terminals T1, T2 is supplied with its respective electrical signal S1, V1, S2, V2, thereby facilitating the creation of the amorphous area 11' substantially between that given electrical terminal T1, T2 and the reference terminal T3. In this scenario, the respective electrical signal S1, V1, S2, V2 that is supplied to the given electrical terminal comprises the phase-altering signal.

In another scenario in an embodiment of the present invention, each of the electrical terminals T1, T2 is supplied with its respective electrical signal S1, V1, S2, V2 so that together the supplied respective electrical signals in this scenario comprise the phase-altering signal. In this case, the amorphous area 11' is created substantially between the given electrical terminals T1, T2 each of which is supplied with its respective electrical signal S1, V1, S2, V2 and the reference electrical terminal T3.

Regarding timing considerations for the provision of the respective electrical signals S1, V1, S2, V2 to the electrical terminals T1, T2: each of the electrical terminals T1, T2 may be provided with its respective electrical signal S1, V1, S2, V2 at substantially the same time or the respective electrical signals S1, V1, S2, V2 may be provided delayed relative to each other by a given time-delay that may be chosen such that the respective electrical signals S1, V1, S2, V2 overlap with each other in the time-domain. The given time-delay may also be chosen such that there is no overlap between the respective electrical signals S1, V1, S2, V2 in the time-domain. The individual length of each of the electrical signals S1, V1, S2, V2, that is, a time-duration where the electrical signal S1, V1, S2, V2 has a magnitude greater than zero, may also be varied and each of the respective electrical signals S1, V1, S2, V2 may have different individual lengths from each other.

In an embodiment of the present invention, the amorphous area 11' created in the phase-change material 11 between the reference electrical terminal T3 and the electrical terminal T1 has a corresponding electrical resistance R1. Likewise, the amorphous area created in the phase-change material 11 between the reference electrical terminal T3 and the electrical terminal T2 has a corresponding electrical resistance R2. The respective electrical resistances R1, R2 between each of the two electrical terminals T1, T2 and the reference electrical terminal T3 are measured by a resistance measurement unit 13 that is accessible when an embodiment of the present invention is in use.

In an embodiment of the present invention, the respective electrical resistances R1, R2 between each of the two electrical terminals T1, T2 and the reference electrical terminal T3, which are measured by the resistance measurement unit 13, are accessed by/provided to a mathematical operation unit 14. The mathematical operation unit 14 is configured to determine at least a mathematical relation between the respective electrical resistances R1, R2. In this regard, the mathematical relation unit 14 is configurable to calculate a difference between the respective electrical resistances R1, R2 measured between each of the two electrical terminals T1, T2 and the reference electrical terminal T3, which resistance difference metric gives information on the position/spatial distribution of the amorphous area 11' formed in the phase-change material 11 in between the two electrical terminals T1, T2 and the reference electrical terminal T3. In an embodiment of the present invention, the mathematical relation unit 14 may also be configurable to calculate a sum of the respective electrical resistances R1, R2 measured between each of the two electrical terminals T1, T2 and the reference electrical terminal T3, which gives information on the size of the amorphous area 11' formed in the phase-change material 11 between the two electrical terminals T1, T2 and the reference electrical terminal T3. The mathematical relation unit 14 may also be configurable to perform a mathematical operation of: the resistance difference metric calculated for the two electrical resistances R1, R2 with the calculated sum of the respective electrical resistances R1, R2 measured between each of the electrical terminals T1, T2 and the reference electrical terminal T3. The mathematical relation unit 14 may further also be configured to perform a mathematical operation of either of the electrical resistances R1, R2 measured between each of the two electrical terminals T1, T2 and the reference electrical terminal T3 with: the difference calculated between the respective electrical resistances R1, R2, the sum calculated of the electrical resistances R1, R2, or a combination thereof.

In an embodiment of the present invention, the mathematical relation unit 14 and/or the resistance measurement unit 13 may be provided as a part of an integrated electrical circuit comprising the phase-change memory cell 10 or to be remotely situated therefrom. In the latter case, the mathematical relation unit 14 may be provided in a data processor, such as, for example, a computer.

In an embodiment of the present invention, the two electrical terminals T1, T2 are electrically isolated from each other by an insulator 12 provided between them. For the insulator 12, a material that has both electrical isolation and thermal insulation properties is used, and it may also be provided around the two electrical terminals T1, T2 and the reference electrical terminal T3 in an embodiment of the present invention. By way of example, silicon nitride or silicon oxide may be used for the insulator 12 in an embodiment of the present invention.

Reference is now made to FIG. 3, in which FIGS. 3A to 3H schematically illustrate examples of the formation of the amorphous area 11', for the application of given values of V1 and V2 to the electrical terminals T1, T2, in an embodiment of the present invention as shown in FIG. 2. FIG. 3I is shown as a part of FIG. 3; it schematically illustrates the resistance difference metric values corresponding to FIGS. 3A to 3H. In FIG. 3I, the x-axis denotes the voltage value V1 applied to the electrical terminal T1, and the voltage value V2 applied to the electrical terminal T2, of an embodiment of the present invention as shown in FIG. 2. The square insets 3A' to 3H' represent the calculated respective resistance difference metric values, that is, the difference between the respective electrical resistances measured between each of the two electrical terminals T1, T2 and the reference electrical terminal T3, obtained for FIGS. 3A to 3H.

Figure 3A:
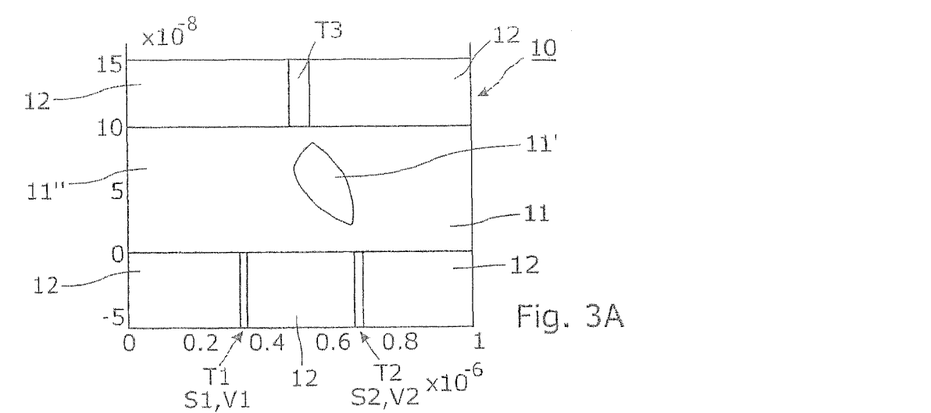
Figure 3B:
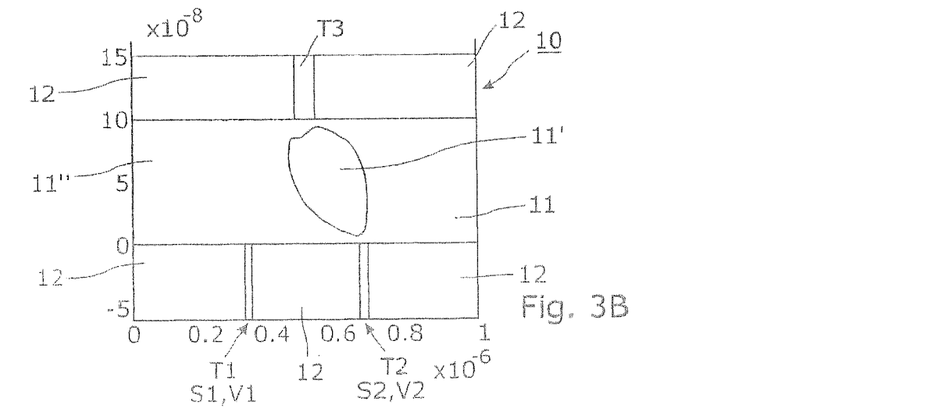
Figure 3C:
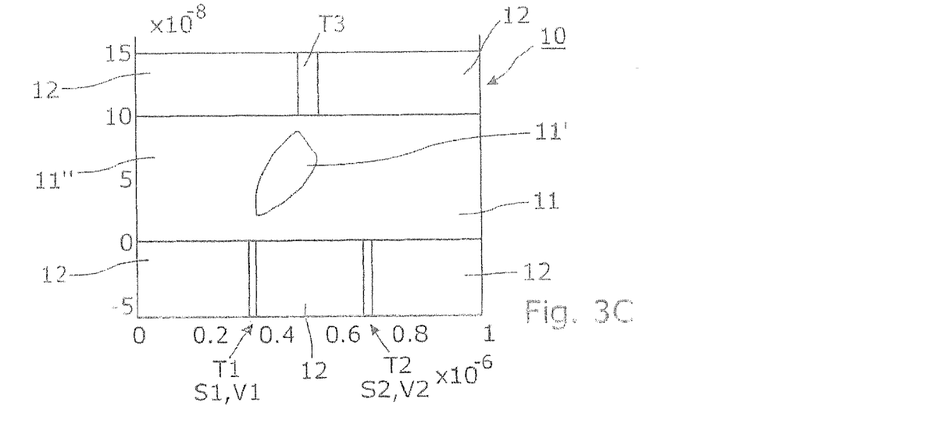
Figure 3D:
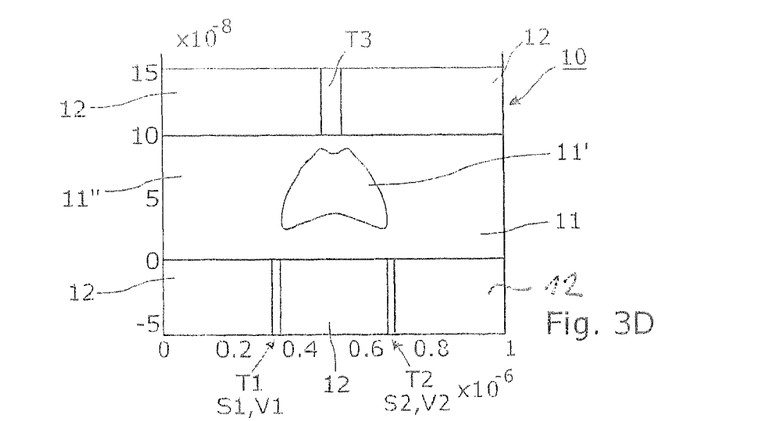
Figure 3E:
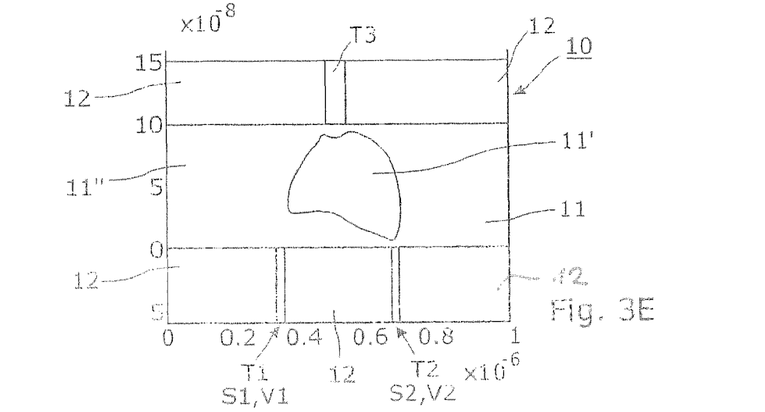
Figure 3F:
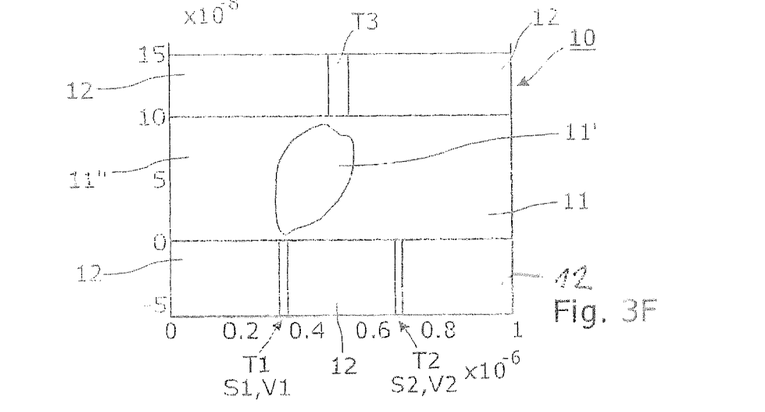
Figure 3G:
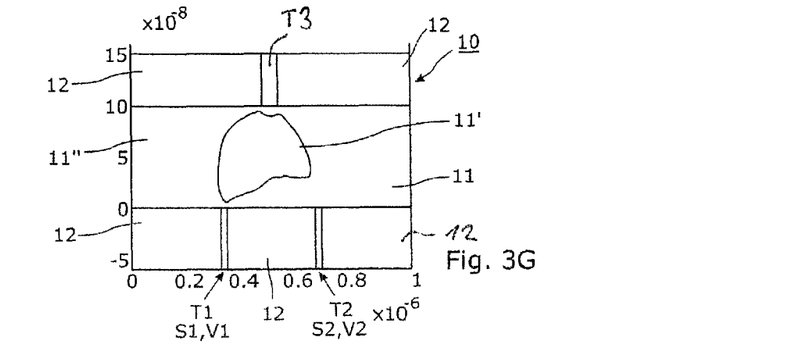
Figure 3H:
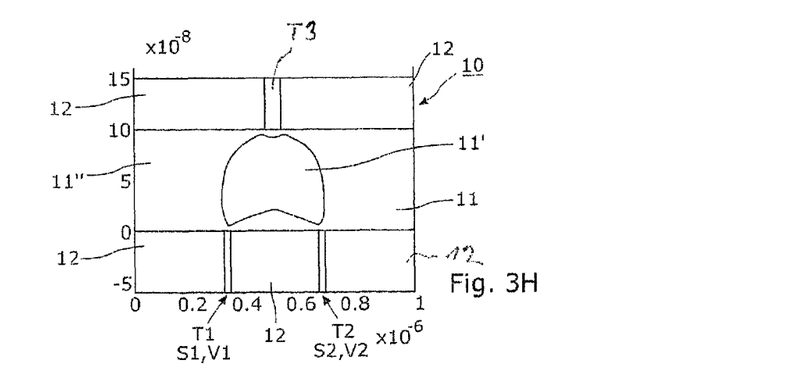
Figure 3I:
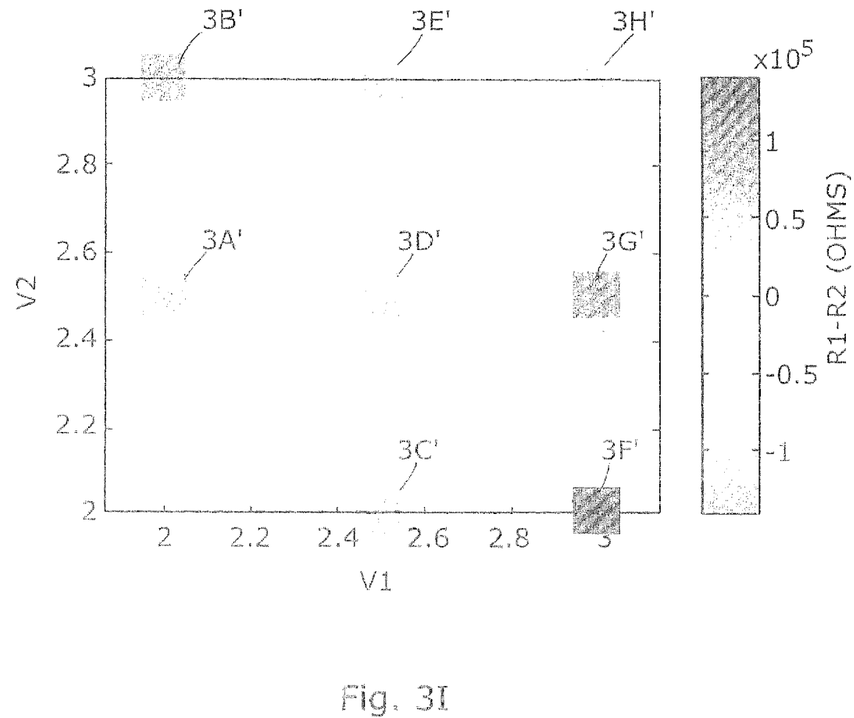

When FIGS. 3A and 3B are viewed in conjunction with FIG. 3I, it can be seen that, the following respective scenarios apply to an embodiment of the present invention: in the scenario of FIG. 3A, V1 is approximately 2V and V2 is approximately 2.5V, and in the scenario of FIG. 3B, V1 is approximately 2V and V2 is 3V. The scenarios of FIGS. 3A and 3B have in common that, since V2 is higher than V1 in both cases, the amorphous area 11' is substantially formed between the electrical terminal T2 and the reference electrical terminal T3. Since V2 applied in the scenario of FIG. 3B is higher than for in FIG. 3A, the size of the amorphous area 11' in FIG. 3B is larger as compared to that in FIG. 3A. Regarding the resistance difference metric, it has a larger magnitude for the scenario of FIG. 3B as compared to FIG. 3A as can be seen from the shading of the corresponding insets 3A' and 3B' in FIG. 3I; the polarity of the resistance difference metric values is, for both cases, negative. Since the size of the amorphous area 11' is larger in FIG. 3B compared to FIG. 3A, the sum of the respective electrical resistances R1, R2 measured between each of the two electrical terminals T1, T2 and the reference electrical terminal T3 is higher in the case of FIG. 3B than for FIG. 3A.

A comparison is now drawn between FIGS. 3B and 3F, this being done in conjunction with FIG. 3I. For FIG. 3F, V1 is approximately 3V and V2 is 2V whereas, and conversely, for FIG. 3B, V1 is approximately 2V and V2 is 3V. In the present example, the size of the amorphous area 11' is substantially the same for both scenarios since they differ from each other in that approximately the same voltage is applied to a different terminal in the respective scenarios. Thus, the sum of the respective electrical resistances R1, R2 measured between each of the two electrical terminals T1, T2 and the reference electrical terminal T3 is substantially the same in both the scenarios of FIG. 3B and FIG. 3F. For FIG. 3B, V2 is higher than V1; therefore, the amorphous area 11' is substantially formed between the electrical terminal T2 and the reference electrical terminal T3 whereas, for FIG. 3F, V1 is higher than V2 so the amorphous area 11' is substantially formed between the electrical terminal T1 and the reference electrical terminal T3. This difference in the spatial distribution of the amorphous area 11' is registered by way of the resistance difference metric values measured for FIGS. 3B and 3F in that the latter has a positive polarity while the former has a negative polarity.

In FIG. 3C, V1 is approximately 2.5V and V2 is 2V, thus, since V1 has a greater magnitude than V2, the amorphous area 11' is formed substantially between the electrical terminal T1 and the reference electrical terminal T3, this being registered in the negative value obtained for the resistance difference metric in this case as can be seen from the corresponding inset 3C' in FIG. 3I.

In FIG. 3D, V1 and V2 are both approximately 2.5V, therefore, the amorphous area 11' is formed substantially between the electrical terminals T1, T2 and the reference electrical terminal T3, in this case, with a spatial volume being approximately evenly distributed therebetween. Since the respective electrical resistances R1, R2 measured between each of the two electrical terminals T1, T2 and the reference electrical terminal T3 are substantially the same, the resistance difference metric is approximately 0 as can be seen from inset 3D' in FIG. 3I, which corresponds to the presently-discussed scenario. The sum of the respective electrical resistances R1, R2 measured between each of the two electrical terminals T1, T2 and the reference electrical terminal T3 in this case is higher compared to what is registered for FIG. 3C, for example.

Referring to FIG. 3E, V1 is approximately 2.5V and V2 is 3V. Since V2 slightly exceeds V1, the amorphous area 11' is distributed to more of an extent between electrical terminals T2 and reference electrical terminal T3 as compared between electrical terminal T1 and reference electrical terminal T3. Compared to FIG. 3D, for example, the resistance difference metric of the scenario shown in FIG. 3E has a more negative magnitude as represented by the shading of insets 3D' and 3E' in FIG. 3I. The sum of the respective electrical resistances R1, R2 measured between each of the two electrical terminals T1, T2 and the reference electrical terminal T3 in FIG. 3E is higher than what is obtained for FIG. 3D. The scenario of FIG. 3G is converse to what has hereinbefore been described with reference to FIG. 3E.

Regarding the scenario of FIG. 3H, it is generally as hereinbefore described with reference to FIG. 3D but differs in that the respective size of the amorphous area 11' formed between each of the two electrical terminals T1, T2 and the reference electrical terminal T3 is larger than for FIG. 3D and so the sum of the respective electrical resistances R1, R2 measured between each of the two electrical terminals T1, T2 and the reference electrical terminal T3 is higher than in FIG. 3D.

An embodiment of the present invention as hereinbefore described with reference to FIGS. 2 and 3 provides the advantage that $3^2-(3-1)=7$ resistance levels may be provided for information storage by way of the resistance difference metric in an embodiment of the present invention compared to 3 resistance levels created by V1 or V2 in previously-proposed phase-change memory cells.

Figure 4:
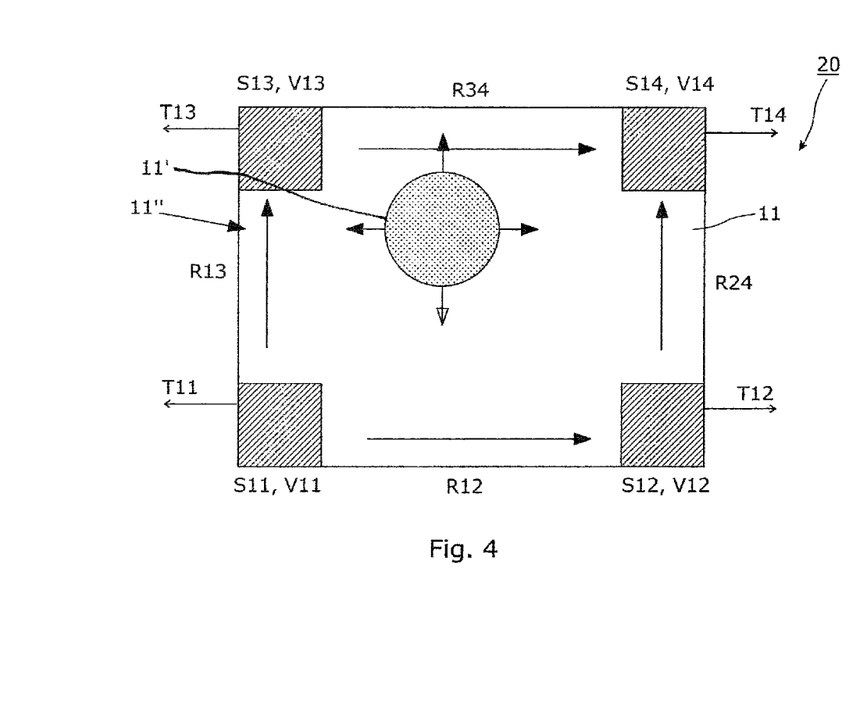

An embodiment of the present invention has been described, by way of example, as comprising three electrical terminals, namely, the reference electrical terminal T3 and the two electrical terminals T1, T2 as shown in FIG. 2. Of course, an embodiment of the present invention is not limited thereto and, indeed, more electrical terminals may be provided. FIG. 4 shows a phase-change memory cell 20 according to an example of another embodiment of the present invention comprising four electrical terminals T11, T12, T13, T14. In the present example, the electrical signals S11, S12, S13, S14 are chosen to be respective voltage signals V11, V12, V13, V14 that are supplied to each of the electrical terminals T11, T12, T13, T14 and that are configured to comprise a phase-altering signal that causes a phase-transition of the phase-change material 11 from a crystalline phase to an amorphous phase. In this way, an amorphous area 11' may be created in the phase-change material 11 substantially between the electrical terminals T11, T12, T13, T14. The flow of current and, therefore, temperature distribution between each of the electrical terminals T11, T12, T13, T14 is determined by the respective voltage pulses V11, V12, V13, V14 applied thereto. Thus, a desired spatial distribution and size of the amorphous area 11' created in the phase-change material 11 between the electrical terminals T11, T12, T13, T14 may be obtained by exploiting the magnitudes of the respective voltage pulses V11, V12, V13, V14.

Although not shown, an embodiment of the present invention shown in FIG. 4 has, as for the case shown and hereinbefore described with reference to FIG. 2, access to a resistance measurement unit 13 and a mathematical relation unit 14. The resistance measurement unit 13 is configurable to measure a respective electrical resistance R12, R24, R34, R13 between each electrical terminal and at least a neighboring electrical terminal in the phase-change memory cell 20. In this case, the mathematical relation unit 14 may be configured to calculate a given mathematical relation between the respective electrical resistances R12, R24, R34, R13 measured by the resistance measurement unit 13 for a given set of electrical terminals comprising at least two neighboring pairs of electrical terminals such as, for example, a difference therebetween and/or a sum thereof. So, for example, the mathematical relation unit 14 may be configured as hereinbefore described with reference to FIG. 2, to determine a mathematical relation between electrical resistance R13 measured between the pair of electrical terminals T11 and T13, and the electrical resistance R34 measured between the pair of electrical terminals T13 and T14, where these given pairs of electrical terminals neighbor each other and where the common electrical terminal T13 between the given pairs of electrical terminals T11, T13, T14, T13 in the present example of an embodiment of the present invention may be taken to be analogous to reference electrical terminal T3 in FIG. 2. Indeed, an embodiment of the present invention is not limited to a particular common terminal electrical between two given pairs of electrical terminals being analogous to the reference electrical terminal T3 and indeed this analogy may be drawn for any one of the electrical terminals T11, T12, T13, T14 that is common in two given pairs of electrical terminals for an embodiment of the present invention as shown in FIG. 4.

Of course, an embodiment of the present invention is not limited to the configuration/implementation of electrical terminals as shown in either of FIG. 2 or 4 and indeed alternative configurations/implementations within the scope of the present invention may be used.

To facilitate the creation of the hotspot, and therefore, the amorphous area 11', as desired in the phase-change material 11, a geometric design of the phase-change memory cell 10, 20 may be altered. In an embodiment of the present invention, this may be achieved by altering at least a geometric design of at least one of the electrical terminals T1, T2; T11, T12, T13, T14, such as, for example, a radius, length or a combination thereof. Alternatively, thermal confinement in the phase-change memory cell 10, 20 may be done selectively by, for example, using different insulators 12 to achieve thermal insulation around a given pair of electrical terminals T1, T2.

The present invention has been described above purely by way of example and modifications of detail can be made within the scope of the invention.

Each feature disclosed in the description, and where appropriate, the claims and the drawings may be provided independently or in any appropriate combination.

The invention claimed is:

1. A phase-change memory cell, comprising:
a phase change material;
a reference electrical terminal disposed on first side of the phase change material;
first and second electrical terminals disposed on a second side of the phase change material, the first and second electrical terminals being separated by an insulator disposed therebetween;
the phase-change material configured to be reversibly transformable between an amorphous phase and a crystalline phase, in response to a phase-altering electrical signal applied to the phase-change material via the reference electrical terminal and one or more of the first and second electrical terminals;
a resistance measurement unit configured to measure a respective electrical resistance between each of the first and electrical terminals and the reference electrical terminal; and
a mathematical operation unit configured to determine a mathematical relation between the respective electrical resistances measured between each of the electrical terminals and the reference electrical terminal;
wherein a characteristic of the respective electrical signals supplied to the electrical terminals is selected so that an amorphous area of a desired size and spatial distribution is formed in the phase-change material such that the spatial distribution of the amorphous area is independently variable in size along a first direction defined between the reference electrical terminal and the first electrical terminal, and variable in size along a second direction defined between the reference electrical terminal and the second electrical terminal, so as to provide at least 7 different discernable resistance levels.

2. The phase-change memory cell of claim 1, wherein the mathematical relation unit is configured to calculate a difference between the respective electrical resistances measured between each of the first and second electrical terminals and the reference electrical terminal.

3. The phase-change memory cell of claim 1, wherein the mathematical relation unit is configured to calculate a sum of the respective electrical resistances measured between each of the first and second electrical terminals and the reference electrical terminal.

4. The phase-change memory cell of claim 1, wherein the mathematical relation unit is configured to perform a mathematical operation of at least one of the respective electrical resistances measured between each of the electrical terminals and the reference electrical terminal with: the difference calculated between the respective electrical resistances, the sum calculated of the respective electrical resistances or a combination thereof.

5. The phase-change memory cell of claim 1, wherein the resistance measurement unit is configured to measure a respective electrical resistance between each electrical terminal and at least a neighboring electrical terminal in the phase-change memory cell.

6. The phase-change memory cell of claim 1, wherein the mathematical relation unit is a part of, or remotely situated from, an integrated electrical circuit comprising the phase-change memory cell.

7. The phase-change memory cell of claim 1, wherein at least a geometric design of at least one of the electrical terminals is selected to facilitate a desired alteration of a thermal environment of the phase-change memory cell.

8. The phase-change memory cell of claim 7, wherein a radius of an electrical terminal, a length of an electrical terminal or a combination thereof is altered.

9. The phase-change memory cell of claim 1, wherein the phase-altering signal is selected thereby to facilitate a phase-transition from a crystalline phase to the amorphous phase in the phase-change material.

10. The phase-change memory cell of claim 1, wherein a characteristic of the respective electrical signals supplied to the electrical terminals is selected so that an amorphous area of a desired size and spatial distribution is formed in the phase-change material.

11. The phase-change memory cell of claim 1, wherein each of the electrical signals is selected to be a respective voltage pulse.

12. The phase-change memory cell of claim 1, wherein at least one of the electrical terminals in the phase-change memory cell is supplied with its respective electrical signal.

13. The phase-change memory cell of claim 1, wherein each of the electrical terminals in the phase-change memory cell is supplied with its respective electrical signal.

14. The phase-change memory cell of claim 1, wherein each of the electrical terminals is supplied with its respective electrical signal at substantially the same time.

15. The phase-change memory cell of claim 13, wherein the respective electrical signals are separated from each other in the time-domain by a given time-delay.

16. The phase-change memory cell of claim 13, wherein the respective electrical signals overlap with each other in the time-domain.

17. A non-volatile memory device comprising a phase-change memory cell as claimed in claim 1.

18. A method of operating a phase-change memory cell, the phase-change memory cell comprising a phase change material, a reference electrical terminal disposed on first side of the phase change material, first and second electrical terminals disposed on a second side of the phase change material, the first and second electrical terminals being separated by an insulator disposed therebetween, the phase-change material configured to be reversibly transformable between an amorphous phase and a crystalline phase, the method comprising;
  applying a phase-altering electrical signal to the phase-change material via the reference electrical terminal and one or more of the first and second electrical terminals;
  measuring a respective electrical resistance between each of the electrical terminals and the reference electrical terminal; and
  determining at least a mathematical relation between the respective electrical resistances measured between each of the electrical terminals and the reference electrical terminal;
  wherein a characteristic of the respective electrical signals supplied to the electrical terminals is selected so that an amorphous area of a desired size and spatial distribution is formed in the phase-change material such that the spatial distribution of the amorphous area is independently variable in size along a first direction defined between the reference electrical terminal and the first electrical terminal, and variable in size along a second direction defined between the reference electrical terminal and the second electrical terminal, so as to provide at least 7 different discernable resistance levels.

* * * * *